US007149991B2

(12) United States Patent
Kovacs-Birkas et al.

(10) Patent No.: US 7,149,991 B2
(45) Date of Patent: Dec. 12, 2006

(54) CALIBRATING A WIRE LOAD MODEL FOR AN INTEGRATED CIRCUIT

(75) Inventors: Attila Kovacs-Birkas, Santa Clara, CA (US); Wolfgang Roethig, Santa Clara, CA (US); Nader J. Haddad, Santa Clara, CA (US)

(73) Assignee: NEC Electronics America, Inc., Santa Clara, CA (US)

( * ) Notice: Subject to any disclaimer, the term of this patent is extended or adjusted under 35 U.S.C. 154(b) by 0 days.

(21) Appl. No.: 10/158,670

(22) Filed: May 30, 2002

(65) Prior Publication Data

US 2004/0205683 A1 Oct. 14, 2004

(51) Int. Cl.
*G06F 17/50* (2006.01)

(52) U.S. Cl. ............................................. 716/6; 716/4

(58) Field of Classification Search ................ 716/4–6, 716/8, 10
See application file for complete search history.

(56) References Cited

U.S. PATENT DOCUMENTS

| 5,802,349 | A | | 9/1998 | Rigg et al. ...................... 716/2 |
| 5,818,726 | A | | 10/1998 | Lee ............................. 716/10 |
| 5,831,863 | A | | 11/1998 | Scepanovic et al. ........... 716/9 |
| 5,914,887 | A | | 6/1999 | Scepanovic et al. ........... 716/8 |
| 5,930,499 | A | | 7/1999 | Chen et al. ..................... 716/8 |
| 5,956,497 | A | * | 9/1999 | Ratzel et al. ................... 716/1 |
| 5,984,510 | A | | 11/1999 | Guruswamy et al. ........... 716/9 |
| 6,006,024 | A | | 12/1999 | Guruswamy et al. ......... 716/12 |
| 6,058,252 | A | | 5/2000 | Noll et al. ..................... 716/10 |
| 6,145,117 | A | * | 11/2000 | Eng ............................. 716/18 |
| 6,256,768 | B1 | | 7/2001 | Igusa ........................... 716/11 |
| 6,269,467 | B1 | | 7/2001 | Chang et al. ................. 716/18 |
| 6,275,973 | B1 | * | 8/2001 | Wein ............................ 716/10 |
| 6,292,929 | B1 | | 9/2001 | Scepanovic et al. .......... 716/14 |
| 6,298,468 | B1 | | 10/2001 | Zhen ............................. 716/7 |
| 6,308,309 | B1 | | 10/2001 | Gan et al. ...................... 716/8 |
| 6,324,671 | B1 | * | 11/2001 | Ratzel et al. ................... 716/1 |
| 6,360,356 | B1 | * | 3/2002 | Eng ............................. 716/18 |
| 6,367,056 | B1 | | 4/2002 | Lee ............................... 716/5 |
| 6,415,426 | B1 | | 7/2002 | Chang et al. ................... 716/9 |
| 6,446,239 | B1 | | 9/2002 | Markosian et al. ........... 716/10 |
| 6,449,761 | B1 | | 9/2002 | Greidinger et al. ........... 716/10 |
| 6,457,159 | B1 | | 9/2002 | Yalcin et al. ................... 716/6 |
| 6,493,863 | B1 | * | 12/2002 | Hamada et al. ............... 716/18 |

(Continued)

OTHER PUBLICATIONS

Benkoski, Jacques, et al. The Role of Timing Verification in Layout Synthesis, ACM, 1991, pp. 612-619.

(Continued)

*Primary Examiner*—Jack Chiang
*Assistant Examiner*—Brandon Bowers
(74) *Attorney, Agent, or Firm*—Skjerven Morrill LLP (57) ABSTRACT

A method is taught for determining a calibrated wire load model. The calibrated wire load model can be used to reach timing closure for an integrated circuit. The method includes; determining a reference timing description; determining a wire load model based on synthesis; determining a wire load model based connectivity; comparing the wire load model based on connectivity to the reference timing description. The method teaches adjusting the wire load model based on connectivity to determine a wire load model which faciliates timing closure. The method also teaches comparing the wire load model (based on synthesis) with the reference timing description. The disclosure contemplates a computer program product based upon the method taught. The disclosure further contemplates an integrated circuit designed based on the method taught. In another embodiment a computer system or another electronic system includes an integrated circuit designed by the method taught.

9 Claims, 7 Drawing Sheets

U.S. PATENT DOCUMENTS

| | | | |
|---|---|---|---|
| 6,519,749 B1 | 2/2003 | Chao et al. | 716/9 |
| 6,536,028 B1 | 3/2003 | Katsioulas et al. | 716/7 |
| 6,539,531 B1 | 3/2003 | Miller et al. | 716/15 |
| 6,557,153 B1 | 4/2003 | Dahl | 716/11 |
| 6,609,244 B1 * | 8/2003 | Kato et al. | 716/18 |
| 6,625,787 B1 | 9/2003 | Baxter et al. | 716/6 |
| 6,629,630 B1 | 10/2003 | Adams | 227/180.1 |
| 6,756,242 B1 | 6/2004 | Regan | 438/14 |
| 6,757,874 B1 | 6/2004 | Dahl et al. | 716/2 |

OTHER PUBLICATIONS

Donath, W., et al., "Transformational Placement and Synthesis," IEEE, Mar. 2000, pp. 194-201.

Dutt, Shantanu et al., "Efficient Incremental Rerouting for Fault Reconfiguration in Field Programmable Gate Arrays," IEEE, May 1999, pp. 173-176.

Ginetti, Arnold, et al., "Modifying the Netlist After Placement for Performance Improvement," IEEE, Mar. 1993, pp. 9.2.1-9.2.4.

Lefebvre, Martin, et al., "The Future of Custom Cell Generation in Physical Synthesis," ACM, 1997.

Senouci, S.A., et al., "Timing Driven Floorplanning on Programmable Hierarchical Targets," ACM, 1998, pp. 85-92.

Stenz, Guenter, et al., "Timing Driven Placement in Interaction with Netlist Transformations," ACM, 1997, pp. 36-41.

* cited by examiner

CALIBRATING A WIRE LOAD MODEL FOR AN INTEGRATED CIRCUIT

CROSS-REFERENCE TO RELATED APPLICATION

This application relates to co-pending U.S. patent application Ser. No. 09/946,240, filed on Sep. 5, 2001, entitled "Timing Optimization and Timing Closure for Integrated Circuit Models" naming Wolfgang Roethig and Attila Kovacs-Birkas as inventors, which is assigned to the assignee of this application, the application being hereby incorporated herein by reference in its entirety.

This application relates to co-pending U.S. patent application Ser. No. 09/878,497, filed on Jun. 11, 2001, entitled "Cell Modeling In the Design of An Integrated Circuit" naming Attila Kovacs-Birkas as inventor, which is assigned to the assignee of this application, the application being hereby incorporated herein by reference in its entirety.

BACKGROUND OF THE INVENTION

Present day ultra-large-scale integration (ULSI) circuits may include millions of interconnected active electronic devices fabricated on a silicon substrate and operating at clock rates of 1 Ghz or more. A substantial amount of time and money is needed to design, fabricate, and test such integrated circuits. Electronic design automation (EDA) tools are used in the design phase of integrated circuits to simulate the functional behavior of integrated circuits prior to their fabrication. These tools are used to confirm that an integrated circuit will function properly prior to its fabrication.

EDA tools are becoming more sophisticated in estimating design parameters such as signal transmission delay and power dissipation. Accurate signal delay estimation now generally requires a stronger link between front-end EDA tools which synthesize a design into a netlist of cells (active devices) and back-end EDA tools which place and route the cells of the synthesis. Without such a link, deep-submicron designs of integrated circuits may have to undergo multiple design iterations to meet design specifications. This process can be expensive and time consuming. The number of layout iterations needed to optimize a design generally increases significantly as logic density and clock speed of the integrated circuit increases. A more accurate signal delay estimation during front-end design generally leads to fewer time-consuming layout iterations.

As the minimum feature sizes of integrated circuits continue to shrink and operating speeds increase, the effects on signal delay due to the resistive, capacitive, and inductive parasitics of nets (e.g., wiring) which interconnect the active devices of the integrated circuit become more critical and more difficult to characterize. Accordingly, a complete analysis of the functional behavior of modem integrated circuit designs typically must account for the resistive, capacitive and inductive effects on signal delay of the interconnect paths. In the past, these parasitic effects of interconnect nets could generally be disregarded when simulating the operation of an integrated circuit, because the active devices therein typically dominated the overall signal delay calculations while the delays associated with interconnect nets were typically considered negligible. However, as the minimum feature sizes of integrated circuits continue to shrink, the ratio of interconnect net delay to total delay has increased substantially. EDA tools that predict interconnect signal transmission delay or extract wiring parasitics for back annotation into the circuit typically use distributed RC equivalent networks to model the interconnects.

Figure 1:
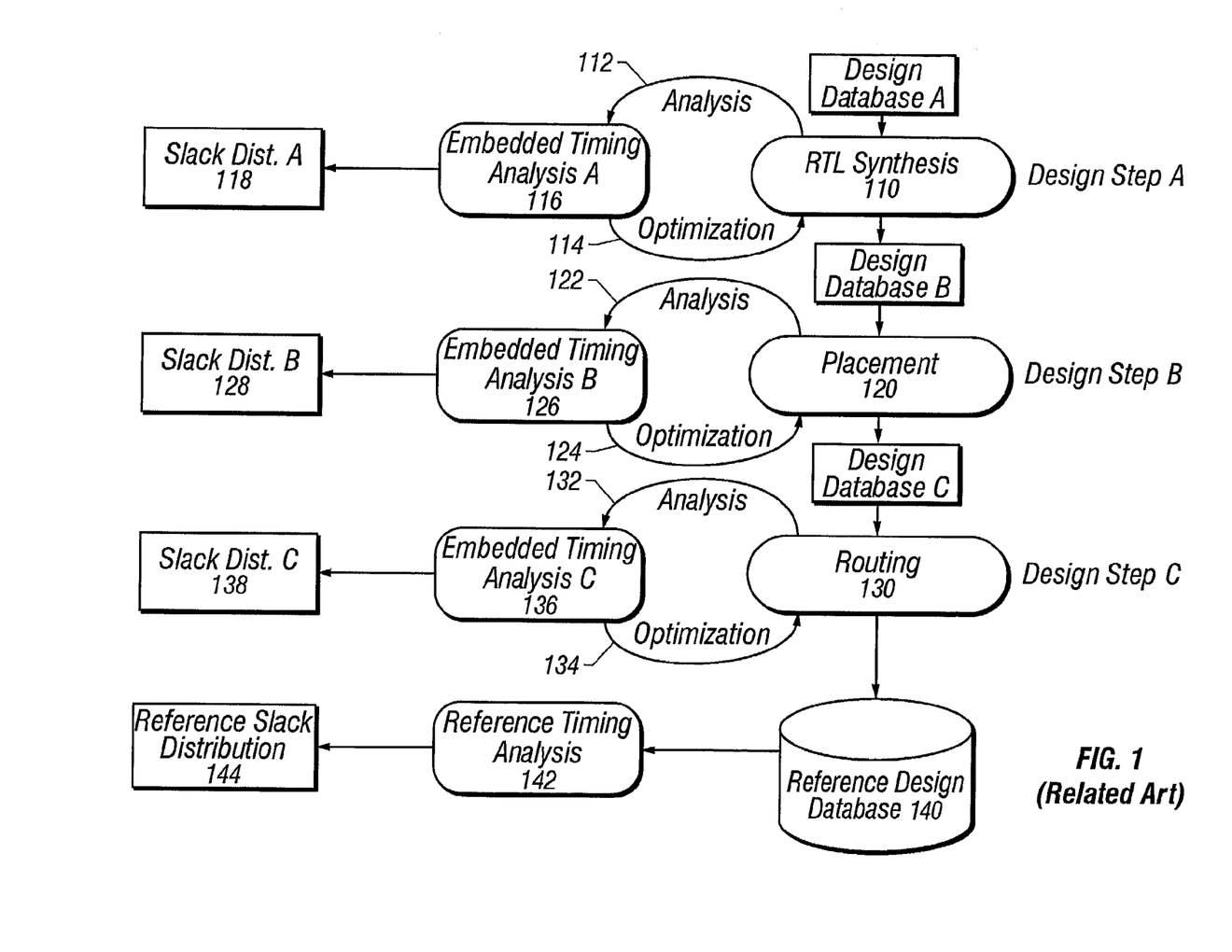
FIG. 1 is a flow diagram illustrating relevant steps of designing an integrated circuit.

FIG. 1 illustrates the steps for designing an integrated circuit). FIG. 1 shows subsequent design steps A, B, and C. As further discussed below, design step A includes design synthesis 110 performed by a synthesis tool. Design step B includes design placement 120 performed by a placement tool. Design step C includes design routing 130 performed by a routing tool.

Synthesis 110 transforms an abstract behavior description of an integrated circuit into a functionally equivalent structural description (i.e., a netlist of cells and wiring interconnect). The behavior description is represented in design database A. The netlist is represented in design database B. The components or cells from which the netlist is built are selected from a library. This library contains information necessary to perform embedded timing analysis on the netlist in design database B. More particularly, the library contains timing models for each of the cells therein. A timing model is a mathematical model of input-to-output delay of a path between an input pin and an output pin of the cell. Such a path is also called a timing arc. The library also contains a parasitic estimation model. The purpose of embedded timing analysis is to enable optimization within 110 until the integrated circuit meets the desired timing specification. The desired timing specification is represented by timing constraints and exceptions from the designer.

Design step A produces a slack distribution 118 which is a representation of the result of embedded timing analysis. Slack is the difference between required signal arrival time and actual signal arrival time at a measurement point in the integrated circuit. A slack distribution histogram displays the number of points for which the slack has a given value within a given resolution. For example, if the X-axis of the histogram displays time with the resolution of one nanoseconds ("ns") and the Y-axis of the histogram displays the value 300 for the time value 7, then 300 points in the integrated circuit have a slack of 7 ns+/−0.5 ns.

Design step B specifies a physical location for each cell of the integrated circuit on a silicon substrate, printed circuit board, etc., based on the netlist in design database B. The result of design step B is represented in design database C. Placement performs embedded timing analysis and optimization. The timing models for arcs used in step B are similar to those used for design step A. However, the parasitic estimation model used in placement timing analysis and optimization is different than that used in step A. In design step A, parasitic estimation was based on structural circuit description only, whereas in design step B placement information is available for more accurate parasitic estimation. Slack distribution B 128, again provides a representation of the result of embedded timing analysis.

Design step C specifies physical interconnect routes between the individual cells based on the structural integrated circuit information and placement information in design database C. The result of design step C is represented in reference design database 140. Routing also performs embedded timing analysis and optimization. The timing model for arcs used in step C is similar to that used in design steps A and B. However, the parasitic estimation model used in placement timing analysis and optimization of step C is different than that used in steps A and B. The estimation model used in step C is more accurate than that used in design steps A and B because specific route information is available. Slack distribution 138 is generated and provides a representation of the result of embedded timing analysis.

Slack distribution 138 again provides a representation of the result of embedded timing analysis for step C.

Reference timing analysis 142 is performed on design database 140 after step C to verify that the integrated circuit design meets the desired timing specification, based on. Reference timing analysis 142 performs embedded timing analysis and optimization. Timing models used in reference timing analysis 142 are similar to those used in design steps A, B, and C. However, the parasitic estimation model is different. Specific route information is available in reference design database 140 for all interconnections of the integrated circuit, whereas in design step C, only partial route information was available, as the routes were being specified. Therefore, the most accurate parasitic estimation model, also called parasitic extraction model, is chosen for timing analysis 142. Slack distribution 148 is generated to provide a representation of the result of embedded timing analysis.

Figure 2:
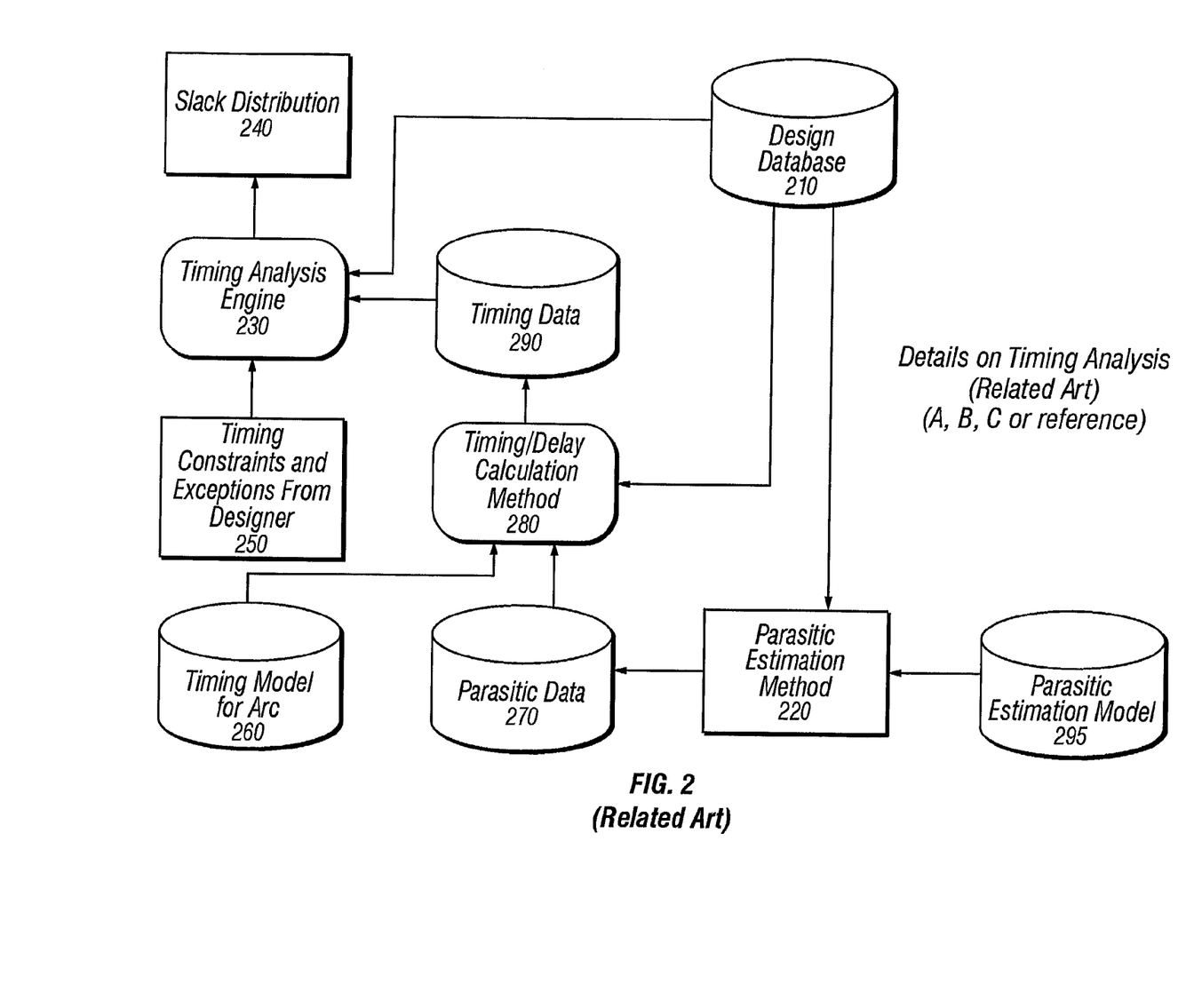
FIG. 2 is a flow diagram illustrating relevant steps for performing timing analysis.

FIG. 2 illustrates relevant details on timing analysis used in the steps shown in FIG. 1. Design database 210 (which corresponds to databases A, B, C or reference design database 140) contains information about the implementation of the integrated circuit. Depending on the available implementation information, an appropriate parasitic estimation model 295 is chosen. The parasitic estimation engine 220 calculates parasitic data 270 based on design database 210 and parasitic estimation model 295. The accuracy of the resulting parasitic data 270 depends on the available implementation information contained in database 210 and on the accuracy of the parasitic estimation model 295. The accuracy of the resulting parasitic data 270 depends also on the parasitic estimation engine 220.

Delay calculation engine 280 calculates timing data 290. This timing data calculation is based on design database 210, parasitic data 270, and timing model for arc 260. The accuracy of the resulting timing data 290 is limited by the accuracy of the parasitic data 270.

Timing analysis engine 230 combines timing data 290 along each path as defined by the structure of the integrated circuit given in design database 210. Timing analysis engine 230 compares the results of combining timing data 290 along each path against timing constraints and exceptions 250 to check whether the desired timing on the paths are met. The result is represented in slack distribution 240.

Timing closure is the agreement between timing results in design steps A, B, and C and the result of timing analysis 142. More particularly, timing closure is meet when the slack distributions resulting from embedded timing analyses in design steps A, B, and C, correlates with the slack distribution resulting from reference timing analysis.

The following conditions are necessary, but not sufficient, to achieve timing closure: similarity between the timing models for arc 260 used in steps A, B, and C; similarity between the delay calculation engines 280 used in steps A, B, and C; similarity between the timing analysis engines 230 used in steps A, B, and C, and; compatibility between timing constraints and exceptions 250 used in steps A, B, and. These conditions can be satisfied by choosing and qualifying appropriate EDA tools used in steps A, B, C and the reference timing analysis. For example: Design step A can be performed by the Design Compiler tool from Synopsys or by the BuildGates tool from Cadence; design step B can be performed by the Qplace tool from Cadence; and design step C can be performed by the Wroute tool from Cadence or by the Apollo tool from Avant!. Alternatively, a combination of design step A and design step B can be performed by the Physical Compiler tool from Synopsys, or the PKS tool from Cadence, etc.

Estimating the parasitics for each wire is one of the problems which arise during attempts to achieve timing closure in the design of an integrated circuit. In the front end of the design phase the placement, the length of each wire is not known. As such, the actual parasitic effects on signal delay cannot be accurately predicted at the front end of the design phase. A lumped resistance, capacitance, and inductance (RCL) is estimated for each wire at the front end of the design phase. Using a lumped RCL allows a designer to attempt to match the total distributed RCL on a wire which results in the back end of the design phase. But even if the estimated lumped RLC at the front end matches total RLC at the back end, the timing would not match, since the effect of distribution of the lumped RLC is neglected in the front end. Another problem is the lack of one-to-one correspondence of logical and physical wires. A logical wire may be broken into multiple physical wires by inserting buffers.

In theory, different timing engines analyzing a design under equivalent constraints should give matching results. However, for the following reasons the results must be verified for each design. Convergent timing arcs on a path may be handled algorithmically different by different engines. Timing exceptions (i.e. exclusion of non-relevant paths from analysis) may be handled differently by different engines, or the user may have made mistakes in specifying the intentionally equivalent timing exceptions in different tool-specific languages. This problem would be solved by using the same timing engine for each design step, but this is often not possible. A unique timing engine is embedded in each design tool. The unique timing engines cannot be exchanged between design tools. (As an analogy, a motor is an integral part of a car and cannot be arbitrarily replaced by a motor designed for a different car.)

Attempts in the related art to drive the EDA tools towards a common timing target by correlating the different factors of influence (e.g., electrical parasitics, timing characterization models, and timing engines) in isolation. In some instances, even with a large number of iterations, the timing correlation cannot be satisfied. As a consequence, the synthesis tool, the placement tool and the routing tool may anticipate a different timing result than the actually achieved timing result. Under design leads to excessive iterations, increasing the cost and delaying the production of the design. In the case of over design, the lack of timing correlation leads to a circuit which is larger, slower or consumes more power than necessary to accomplish the desired function.

SUMMARY OF THE INVENTION

A method is taught for correlating the timing target for each design tool. The method can determine a calibrated wire load model. The calibrated wire load model can be used to reach timing closure for an integrated circuit. The method includes; determining a reference timing description; determining a wire load model based on synthesis; determining a wire load model based connectivity; comparing the wire load model based on connectivity to the reference timing description. The method teaches adjusting the wire load model based on connectivity to determine a wire load model which faciliates timing closure. The method also teaches comparing the wire load model (based on synthesis) with the reference timing description.

The disclosure contemplates a computer program product based upon the method taught. The disclosure further contemplates an integrated circuit designed based on the method taught. In another embodiment a computer system or another electronic system includes an integrated circuit designed by the method taught.

The disclosure contains, by necessity, simplifications, generalizations and omissions of detail; consequently, those skilled in the art will appreciate that the disclosure is illustrative only and is not intended in any way to be limiting.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting. As previously described, accurate timing management throughout the design process is necessary for an integrated circuit to operate correctly. The length of net connections in an integrated circuit determines the operating frequency, or speed, of the chip. The objective is a design with the shortest possible connections. Similarly, an integrated circuit with shorter net connections will be a smaller chip. A method to select the shortest possible connections will result in a design with the optimum solution for area and timing. The desired solution for area and timing produces a minimum of timing slacks with no timing violations.

The present invention provides timing correlation before and after layout and balances timing margins. Balancing the timing margin of an integrated circuit produces a design which operates as specified at a higher speed without errors being introduced by too small timing margin. The present invention provides a design with sufficient timing margin to prevent operational errors but a small enough timing margin to prevent overdesign (i.e., a circuit which is too large and too expensive to manufacture).

The present invention provides a method for managing the timing margin added before layout to ensure correct operation after layout. A large timing margin results in a circuit operating at less than its optimum speed. A small timing margin results in signals that arrive at their intended destination after they are expected. Signals which arrive after they have been predicted to arrive can introduce errors in the function of the circuit and can further create errors in a design resulting in a manufactured integrated circuit which does not perform as intended.

The delay of a signal traversing a path in an integrated circuit must be between specified upper and lower bounds.

The upper and lower bounds of each path are derived from constraints. Timing analysis tools thus derive the upper and lower bounds from the constraints and calculate the delay on each path and report the difference between the upper and lower bound and the actual delay. In order to calculate the delay on each path, electrical parasitics must be estimated or extracted and delay on each timing arc must be calculated. This calculation uses timing models supplied in a characterization library. Timing analysis checks the delay against those bounds and reports slack as the difference between the actual delay and the respective bound.

Timing histograms are a statistical way of representing time slack. Negative time slack is also called "violation." Positive time slack is often called "slack" for shortness. Eliminating violations is necessary to produce a design, which functions as intended. However, eliminating violations produces slack. Ideally, the time slack should be zero. Positive slack indicates overdesign, i.e. a circuit that is too large and/or too expensive and operates slower than intended.

Without calibration, histograms taken at different design phases (e.g. before placement, before routing, after routing) will show a significantly different slack distribution. Different slack distributions are due to different estimated parasitics. In the front end of the design phase only lumped estimated parasitics are available. In later design phases more accurate, distributed parasitics are available. Parasitic estimation varies from EDA tool to EDA tool. However, histograms taken as snapshots by different timing analysis tools at the same design phase will also show differences.

Calibrating all histograms to a common reference provides each EDA tool in the design flow the most realistic view of the actual timing. Adjusting the design based on statistical interpretation of the histogram allows a faster design without violations. Previously, no formal method has been available to statistically analyze the histograms.

In a flat (or hierarchical) design the appropriate parasitic estimation model for a given block and a given design step will be chosen. The definition of "block" may vary for different design steps. For example, synthesis may be performed on several blocks which may later be merged into one block for flat layout. Timing analysis will be done after each design step for each block. The results will be displayed in sets of timing histograms and compared (as described further below) to a set of reference timing histograms. The set of reference timing histograms are based on the last design step in the trial design flow using a reference parasitic extraction tool, reference timing analysis tool and reference timing models. The set of reference timing histograms can contain one timing histogram per block as defined in the last design step. Even if the previous design steps (e.g. synthesis) are performed on sub-blocks, the timing analysis results related to the previous design steps must be merged to reflect a histogram for the entire block.

The timing histograms can be analyzed by matching the total number of paths in each histogram corresponding to each block. A mismatch would be due to major discrepancies in timing exception handling by the different timing engines. Therefore, such discrepancy can be detected and corrected by modifying the timing constraint specifications. After such correction, timing analysis is applied again. Although the number of wires can vary, the number of paths does not change significantly during the design steps. This is because the number of wires is mainly governed by electrical and physical design implementation requirements, whereas the number of paths is mainly governed by the logical functionality of the circuit, which by definition does not change during the trial design flow.

Once the number of paths matches, the profile of the timing histograms is compared using a mathematical method. The profiles should match within a certain tolerance. A major mismatch in profile would indicate either a poor choice of parasitic estimation models for sub-blocks or a poor choice of partitioning into blocks and sub-blocks in the first place. Therefore, such poor choices can be detected and corrected. Then the relevant design steps are applied again on the newly partitioned blocks A mathematical method is applied to calibrate the parasitic estimation models with the effect that the timing histograms will be shifted until they all match the reference timing histogram within a certain tolerance. In this step, the differences in parasitic estimation models, timing characterization models and timing analysis algorithms are implicitly compensated for. Explicit knowledge about the significance or preponderance of a particular difference is not required, because the calibration is self-adaptive.

Figure 3:
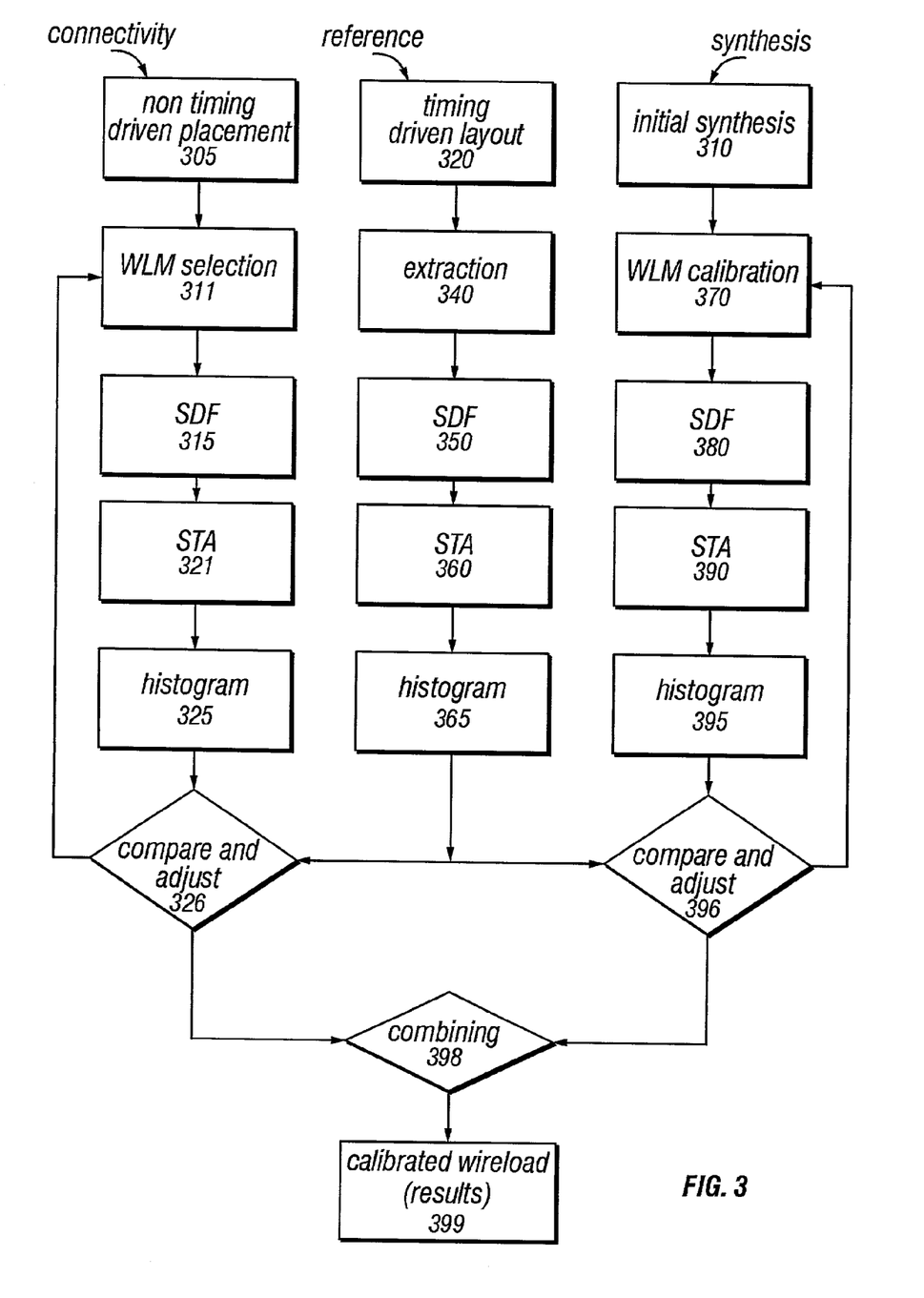
FIG. 3 is a flow diagram illustrating one implementation of the present invention.

FIG. 3 shows a method of selecting a wire load model in accordance with one embodiment of the present invention. More specifically, FIG. 3 shows the three factors which may be considered in calibrating a wire load model. As shown in FIG. 3, one factor is a reference and two factors are variables (connectivity and synthesis). Connectivity depends on the size and shape of the silicon chip. Connectivity determines the timing behavior of the integrated circuit. Synthesis depends on a netlist which describes the desired function of the manufactured integrated circuit. An initial synthesis (not shown in FIG. 3) initializes the synthesis tool with embedded timing analysis and optimization using auto wire load. A hardware description language (HDL) such as Verilog can be used to describe the function of an integrated circuit. In parallel with the HDL description (not shown) a standard delay format (SDF) can be used to describe the timing of the integrated circuit.

Now referring to FIG. 3, the software application discussed in the preceding paragraph is the input of steps 305, 3100 and 320. The first iteration begins with an initial wire load model as further discussed in FIG. 4. From initial synthesis the method proceeds to non-timing driven placement 305. Non-timing driven placement 305 (or non TD placement) is placement without embedded timing analysis. Non TD Placement 305 includes connectivity optimization without any specific determination for placement (e.g., grouping or predefining placement). Connectivity optimization minimizes the total wire length of the design as further discussed in FIG. 4. WLM selection 311 (or "wire load model selection") identifies one of several wire load models to use in the design of interest. (Identifying one of several wire load models is further described in FIG. 5.) Standard delay format (SDF) 315 represents the results of a calculation of timing data for arc based on the wire load model selected in WLM selection 311. Timing data for arc represented in SDF 315 can be similar to logical event 290 previously shown in FIG. 2. From generation of SDF 315 the logical method proceeds to STA 320. STA 320 produces a histogram 325 generated from the wire load model selected in WLM selection 311. The method proceeds to consider the synthesis factor (as described below) before considering the reference factor.

Considering synthesis includes data generated from an external software application (not shown) which used automatic wire load selection based on actual block size. From initial synthesis 310 the method proceeds to WLM calibration 370. In subsequent iterations, WLM Calibration 370 speaks to calibrating a model of wire loads available in a database. From WLM 370 the method proceeds to SDF 380. SDF 380 represents timing data for a timing arc based on the wire load model from logical step 370. SDF 380 can be similar to Timing Data for arc 290 as previously shown in FIG. 2. From SDF 380 the method proceeds to STA 390. STA 390 produces a timing histogram 395 which can be compared to a histogram 365 subsequently calibrated. The method can proceed from synthesis data to considering reference data, as described in the paragraph below.

From initial synthesis (not shown) the method can proceed to timing driven layout (TDL) 320. TDL 320 can be similar to placement step 120 shown in FIG. 1. TDL 330 includes placement with embedded timing analysis and optimization. TDL 330 can further include routing with embedded timing analysis and optimization. Thus, TDL 320 can also include a logical function similar to logical function 130 shown previously in FIG. 1. Extraction 340 can include a parasitic model such as discussed earlier (refer to FIG. 2). As discussed earlier (refer to FIG. 2) the accuracy of extraction 340 can depend on the accuracy of the parasitic estimation model such as parasitic estimation model 295 (shown previously in FIG. 2).

From extraction 340 the method proceeds to SDF 350. SDF 350 can include the actual wire length of the design of interest. SDF 350 can also include delay such as a delay considered in Timing Data for Arc 290 previously shown in FIG. 2. From SDF 350 the method can proceed to STA 360. STA 360 generates a reference timing histogram 365.

Reference timing histogram 365 can be similar to slack distribution 240. Integrated circuits can be tested after manufacture. The results of the test can be gathered into a data file, sometimes called a library. For example, the data file can be similar to Timing Model for Arc 260 (previously shown in FIG. 2). In addition, the data library can include data such as found in Parasitic Estimation Model, 295 (previously shown in FIG. 2).

Still referring to FIG. 3, compare and adjust 326 compares data from histogram 325 and histogram 365. Compare and adjust 326 adjusts the histogram data by adjusting the position of clusters. At least 50% of the blocks will be placed as compact clusters. Therefore automatic wire load selection is used. The remaining blocks will be placed as disjoint clusters. Wire load models will be assigned to those blocks based on the area of a bounding box around the clusters (refer to FIG. 6). Compare and adjust 396 compares data from histogram 365 and histogram 395. Compare and adjust 395 adjusts histogram data using the method described in co-pending patent application Ser. No. 09/946,240 entitled "TIMING OPTIMIZATION AND TIMING CLOSURE FOR INTEGRATED CIRCUIT MODELS." Step 398 combines the data from step 326 and step 396. Step 399 includes the results describing a calibrated wire load model. The calibrated wire load model is used to start the synthesis and timing driven layout. Using the calibrated wire load model with synthesis and timing driven layout facilitates timing closure.

Figure 4:
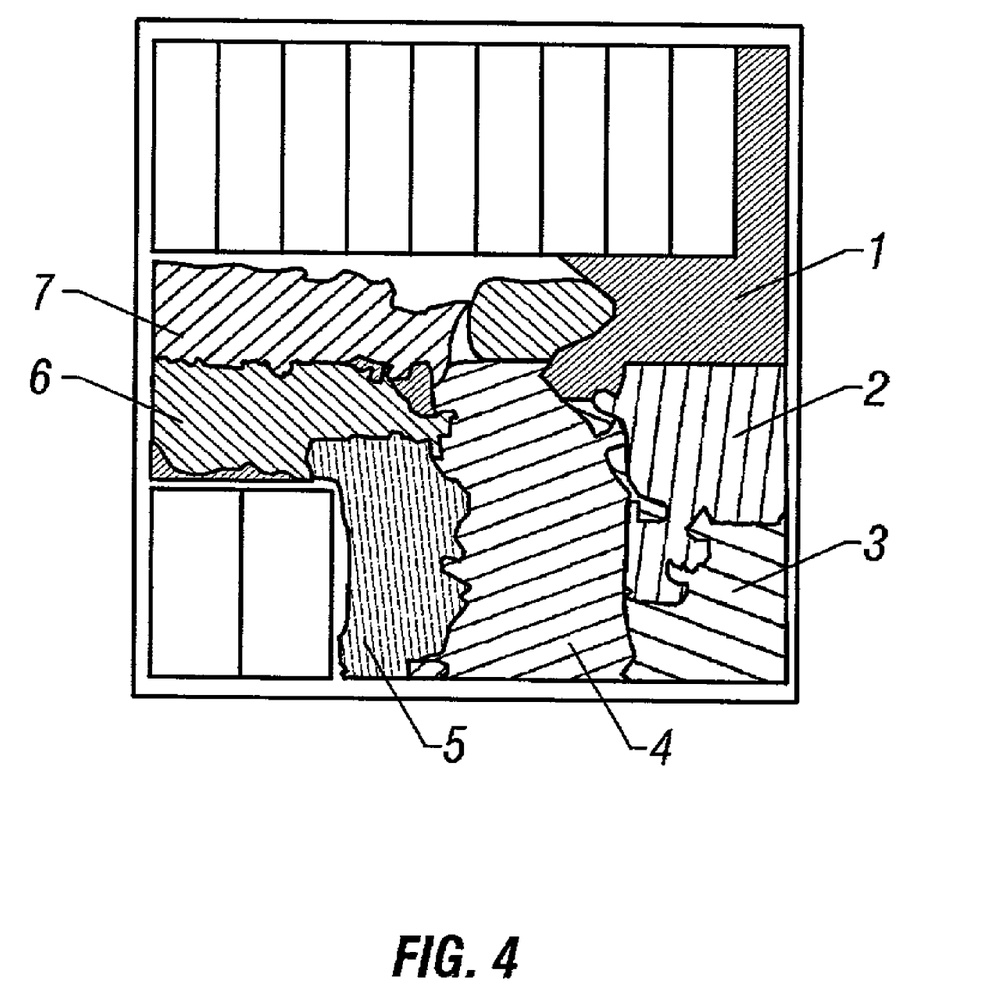
FIG. 4 is an example of a placement solution diagram showing clusters of an integrated circuit generated in accordance with one implementation of the present invention.

FIG. 4 shows the placement of cells within an integrated circuit. The placement was done by a software application tool called placement tool. The different colors highlight sub-circuits or blocks. If no constraints are given to the placement tool, sub-circuits will be placed as compact clusters, if the connectivity within the block (intra-block connectivity) is stronger than the connectivity between blocks (inter-block connectivity). However, there are blocks with weak intra-block connectivity. These will be placed in scattered clusters. A floor plan drawn by the designer of the integrated circuit could force such blocks also to be placed in compact clusters. However, such a manually forced placement would not be as optimal as the unconstraint automatic placement.

Figure 5:
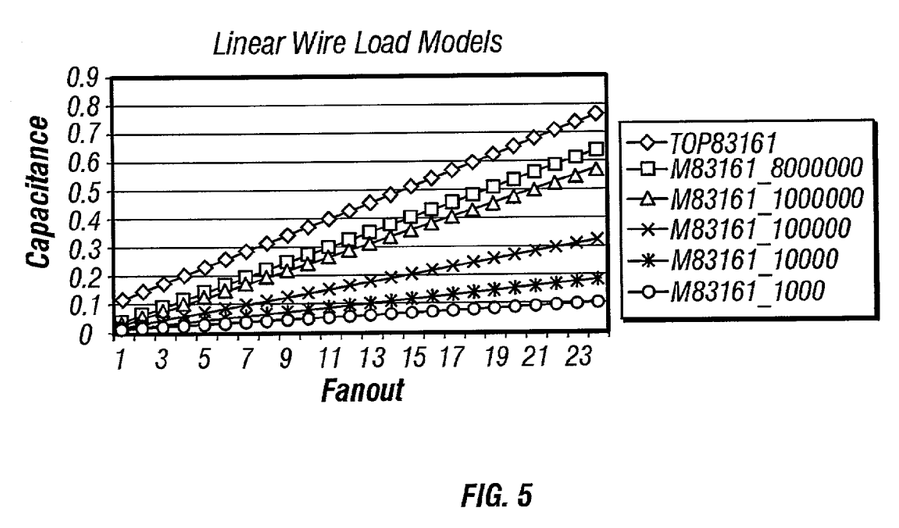
FIG. 5 illustrate relevant aspects of wire load models.

FIG. 5 is an example of wire load model. FIG. 5 is an example of linear wire load models for specific die sizes and specific module sizes. (Specifically, the top curve shown in FIG. 5 represents a wire load for grid size is 1000.) The wire load models shown are adjusted by the method taught. Another adjustment to the wire load model can be made based on the offset of the histograms. One method of determining an offset of histograms is given in Equation 1 and Equation 2, below.

Figure 6:
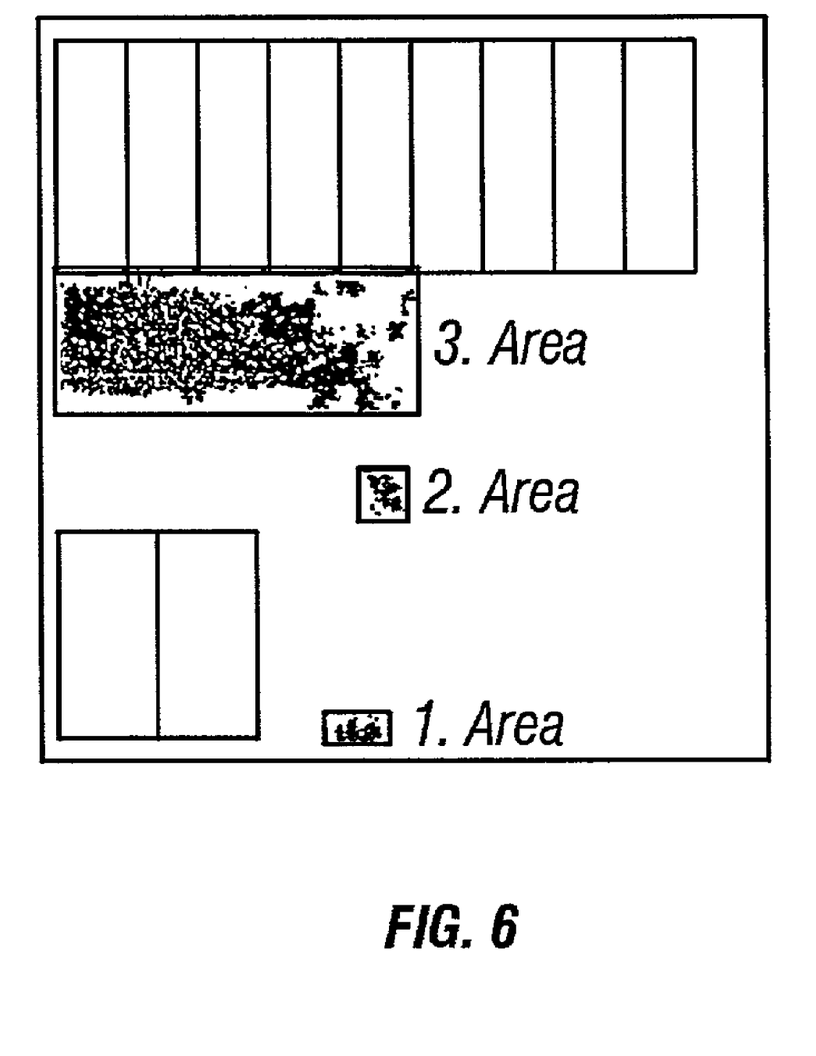
FIG. 6 is a representation of a distributed cluster extracted from FIG. 4.

FIG. 6 shows a block placed in scattered clusters. This block is extracted from FIG. 4. For the purpose of optimizing the timing of a block in the integrated circuit, a wire load model is assigned to the block. This wire load model enables prediction of delay due to wiring. The delay due to wiring depends on the estimated length of the wire, which is statistically related to the area enclosing the block. In the case of compact clusters, the enclosing area is simply the area covered by the block itself. In the case of scattered clusters, the enclosing area also covers empty space (i.e. space occupied by components which are not members of the block), as illustrated in FIG. 6.

Figure 7:
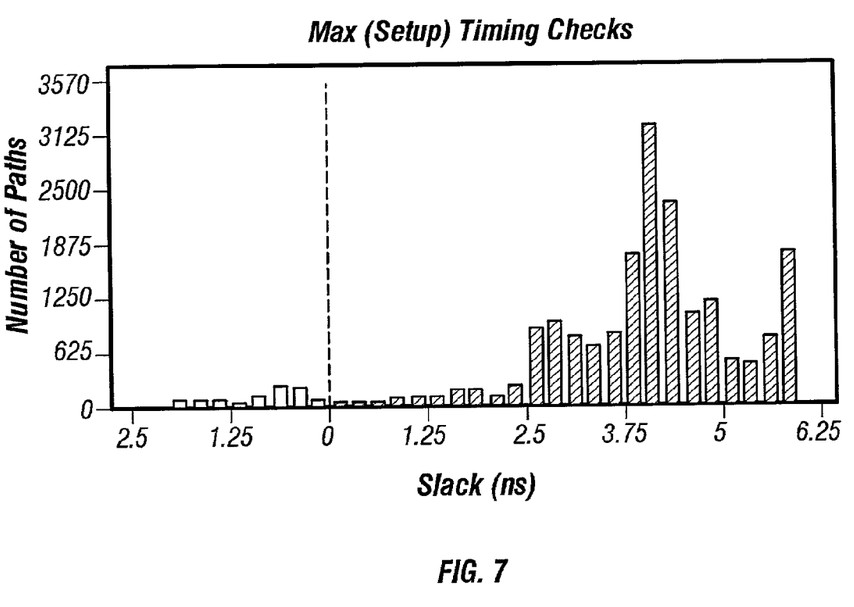
FIG. 7 is an example of a timing histogram.

FIG. 7 is an example of a timing histogram. As previously shown (refer to FIG. 3, step 326 and 396) a histogram can be used for comparison. Referring to FIG. 7, the histogram shows the result of the wire load model selection. The wire load model shown in the histogram can be calibrated to a second histogram. The second histogram (not shown) can include clock trees, routing and cross-talk effects.

Comparing histograms and adjusting design based on timing histogram results provides the necessary method to calibrate an integrated circuit design. A slack histogram is a graphical representation of a slack distribution. Slack distribution can be represented as a discrete function $P(S)$, where P is the number of paths with a given slack S. The autocorrelation function $C_p(T)$ for $P(S)$ is defined by equation 1, below.

$$C_P(T) = \sum_{S=-\infty}^{S=+\infty} P(S) * P(S+T) \quad \text{Equation 1}$$

A measure for matching slack distribution is the normalized error between the data points $C_p(T=0)$, given in Equation 2, below.

$$\text{error} = \frac{C_{P2(T=0)} - C_{P1(T=0)}}{C_{P1(T=0)}} * 100\% \quad \text{Equation 2}$$

Another measure for matching slack distribution is the normalized error between the autocorrelation functions, given by Equation 3, below.

$$\text{error} = \frac{\sum_{T=-\infty}^{T=+\infty} C_{P2}(T) - C_{P1}(T)}{\sum_{T=-\infty}^{T=+\infty} C_{P1}(T)} * 100\% \quad \text{Equation 3}$$

If the error is outside an acceptable bound (e.g., 10%), a poor structural hierarchy of the integrated circuit is the cause. This can be corrected by choosing a different structural hierarchy and repeating all design steps required for creation of design database and reference design database. If the error is within an acceptable bound (e.g., 10%), the intercorrelation function between slack distribution and reference slack distribution is calculated. The intercorrelation function between two slack distributions $P1(S)$ and $P2(S)$ is defined in equation 4, below.

$$C_{P_1,P_2}(T) = \sum_{S=-\infty}^{S=+\infty} P_1(S) * P_2(S+T) \quad \text{Equation (4)}$$

This intercorrelation function has an absolute maximum for a particular value of T. This maximum is compared to the datapoint $CP(T=0)$ from the reference slack distribution. If there is a significant mismatch, a different parasitic estimation model must be selected and all design steps required for creation of design database and reference design database must be repeated.

Co-pending patent application Ser. No. 09/946,240 illustrates the calibration method, applied to the parasitic estimation model. As shown in co-pending patent application Ser. No. 09/946,240, slack distribution resulting from embedded timing analysis performed on the design database is compared with the reference slack distribution from reference the timing analysis performed on the reference design database. In case where N sub-blocks in the design database correspond to one block in reference design database, the slack distribution represents a collapsed slack distribution, corresponding to the collapsed slack distribution. A determination is made if the intercorrelation function has its maximum at T=0. If the maximum is at $T_{max}$, where $T_{max}$ is different from zero, a global scaling factor $A_{shift}$ is applied to the parasitic estimation model. Embedded timing analysis is performed again, based on the scaled parasitic estimation model. The new slack distribution based on embedded timing analysis will have a similar shape as the previous one, but it will be shifted by $T_{shift}$. The goal is to equate $T_{shift}$ with $-T_{max}$. As a result, the new intercorrelation function will have its maximum at T=0. The Newton-Rhapson method can be applied between subsequent iterations.

$$A_{shift} \approx T_{shift} * \Delta A / \Delta T \quad \text{Equation 5}$$

In Equation 5, $\Delta A$ is the difference between $A_{shift}$ in subsequent iterations and $\Delta T$ is the difference between $T_{shift}$ in subsequent iterations. $A_{shift}$ will converge to zero, therefore $T_{shift}$ will also converge to zero.

The operations described above and modules thereof may be executed on a computer system configured to execute the operations of the method and/or may be executed from computer-readable media. The method may be embodied in a machine-readable and/or computer-readable medium for configuring a computer system to execute the method.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of creating a wire load model for an integrated circuit, the method comprising:
synthesizing a first netlist of components for the integrated circuit;
generating a non-timing driven placement of the first netlist of components;
generating a timing driven placement of the first netlist of components;
identifying one of several wire load models;
calculating first timing data based on the identified wire load model and the non-timing placement of the first netlist components;
generating a first histogram from the first timing data;
generating a parasitic estimation model from the timing driven placement of the first netlist of components;
calculating second timing data based on the parasitic estimation model;
generating a second histogram from the second timing data;
synthesizing a second netlist of components for the integrated circuit;
calculating a wire load model for the second netlist of components;
calculating third timing data based on the wire load model for the second netlist of components;
generating a third histogram from the third timing data
comparing the first and second histograms;
comparing the second and third histograms; and
creating a calibrated wire load model in response to comparing the first and second histograms and in response to comparing the second and third histograms.

2. A computer readable medium that stores instructions executable by a computer system, wherein the computer system implements a method for creating a wire load model for an integrated circuit in response to executing the instructions, the method comprising:
synthesizing a first netlist of components for the integrated circuit;
generating a non-timing driven placement of the first netlist of components;
generating a timing driven placement of the first netlist of components;
calculating first timing data based on the non-timing placement of the first netlist components;
generating a first histogram from the first timing data;
calculating second timing data based on the timing driven placement of the first netlist of components;
generating a second histogram from the second timing data;
synthesizing a second netlist of components for the integrated circuit;
calculating third timing data based on the second netlist of components;
generating a third histogram from the third timing data;
comparing the first and second histograms;
comparing the second and third histograms; and
creating a calibrated wire load model in response to comparing the first and second histograms and in response to comparing the second and third histograms.

3. The computer readable medium of claim 2 wherein the method further comprises:
identifying one of several wire load models;
wherein the first timing data is calculated based on the identified wire load model and the non-timing placement of the first netlist components.

4. The computer readable medium of claim 2 wherein the method further comprises:
generating a parasitic estimation model from the timing driven placement of the first netlist of components;
wherein the second histogram is generated based on the parasitic estimation model.

5. The computer readable medium of claim 2 wherein the method further comprises:
calculating a wire load model for the second netlist of components;
wherein the third timing data is calculated based on the wire load model for the second netlist of components.

6. A computer system comprising:
a processor,
a memory coupled to the processor; and
a set of instructions stored in the memory, wherein the set of instructions are executable by the processor, wherein the computer system implements a method for creating a wire load model for an integrated circuit in response to the processor executing the set of instructions, the method comprising:
synthesizing a first netlist of components for the integrated circuit;
generating a non-timing driven placement of the first netlist of components;
generating a timing driven placement of the first netlist of components;
calculating first timing data based on the non-timing placement of the first netlist components;
generating a first histogram from the first timing data;
calculating second timing data based on the timing driven placement of the first netlist of components;
generating a second histogram from the second timing data;
synthesizing a second netlist of components for the integrated circuit;
calculating third timing data based on the second netlist of components;
generating a third histogram from the third timing data;
comparing the first and second histograms;
comparing the second and third histograms; and
creating a calibrated wire load model in response to comparing the first and second histograms and in response to comparing the second and third histograms.

7. The computer system of claim 6 wherein the method further comprises:
identifying one of several wire load models;
wherein the first timing data is calculated based on the identified wire load model and the non-timing placement of the first netlist components.

8. The computer system of claim 6 wherein the method further comprises:
generating a parasitic estimation model from the timing driven placement of the first netlist of components;
wherein the second histogram is generated based on the parasitic estimation model.

9. The computer system of claim 6 wherein the method further comprises:
calculating a wire load model for the second netlist of components;
wherein the third timing data is calculated based on the wire load model for the second netlist of components.

* * * * *